United States Patent
Petrie

(10) Patent No.: US 8,125,257 B2
(45) Date of Patent: Feb. 28, 2012

(54) APPARATUS AND METHOD FOR MODELING COARSE STEPSIZE DELAY ELEMENT AND DELAY LOCKED LOOP USING SAME

(75) Inventor: William Petrie, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 0 days.

(21) Appl. No.: 13/117,934

(22) Filed: May 27, 2011

(65) Prior Publication Data

US 2011/0316598 A1 Dec. 29, 2011

Related U.S. Application Data

(62) Division of application No. 12/192,215, filed on Aug. 15, 2008, now Pat. No. 7,952,404.

(51) Int. Cl.
*H03L 7/06* (2006.01)
(52) U.S. Cl. ......... 327/158; 327/149; 327/161; 327/284
(58) Field of Classification Search .................. 327/149, 327/158, 161, 269–272, 276–278, 284, 285
See application file for complete search history.

(56) References Cited

U.S. PATENT DOCUMENTS

| | | | |
|---|---|---|---|
| 3,829,843 A | 8/1974 | Cichetti, Jr. et al. | |
| 5,295,164 A | 3/1994 | Yamamura | |
| 5,515,403 A | 5/1996 | Sloan et al. | |
| 5,544,203 A | 8/1996 | Casasanta et al. | |
| 5,604,775 A | 2/1997 | Saitoh et al. | |
| 5,963,069 A | 10/1999 | Jefferson et al. | |
| 5,969,551 A | 10/1999 | Fujioka | |
| 6,327,318 B1 | 12/2001 | Bhullar et al. | |
| 6,683,928 B2 | 1/2004 | Bhullar et al. | |
| 6,812,760 B1 | 11/2004 | Kim et al. | |
| 7,038,511 B2 | 5/2006 | Kim et al. | |
| 7,190,202 B1 | 3/2007 | Oh et al. | |
| 7,349,513 B2 | 3/2008 | Bhullar et al. | |
| 7,889,826 B2 * | 2/2011 | Bhullar et al. | 375/374 |
| 7,952,404 B2 * | 5/2011 | Petrie | 327/158 |
| 2004/0091075 A1 | 5/2004 | Bhullar et al. | |

* cited by examiner

*Primary Examiner* — Patrick O'Neill

(57) ABSTRACT

A reference circuit and method for mitigating switching jitter and delay-locked loop (DLL) using same are provided. The reference circuit and method determine a number of steps of a fine delay line (FDL) that are equivalent to a step of a coarse delay line (CDL). Switching jitter of the DLL is reduced since the delay of the step of the CDL that is switched when on an underflow or overflow condition of the FDL is detected is equivalent to the delay of the provided number of steps of the FDL.

13 Claims, 12 Drawing Sheets

APPARATUS AND METHOD FOR MODELING COARSE STEPSIZE DELAY ELEMENT AND DELAY LOCKED LOOP USING SAME

CROSS-REFERENCE TO RELATED APPLICATIONS

This application is a divisional of U.S. application Ser. No. 12/192,215 filed Aug. 15, 2008 herein incorporated by reference.

FIELD OF THE INVENTION

The present invention relates generally to delay-locked loops (DLL). More specifically, the present invention relates to an apparatus and method for mitigating switching jitter in a DLL.

BACKGROUND OF THE INVENTION

A digital delay-locked loop (DLL) generally includes a phase detector which detects the phase difference between a system clock and a feedback clock, and causes adjustment of a time delay circuit in a loop which causes a DLL output clock to be adjusted to lock with the system clock. The time delay is generally provided by an adjustable delay line.

Since the adjustable delay line is typically adjusted in steps, the finest delay resolution depends on the delay line step increments. In order to hold the locked condition, the adjustable delay line is continuously increased and decreased in step increments around a lock point, which results in inherent tracking jitter. In order to reduce the jitter, the adjustable delay line includes a plurality of coarse delay elements (CDE), forming a coarse delay line (CDL), in series with a plurality of fine delay elements (FDE) forming a fine delay line (FDL). After power-up of the circuit, the CDL is adjusted, and once a lock point has almost been determined, the FDL is adjusted, which narrows the window or eye around the lock point, which represents a nominal amount of jitter in a typical application.

The FDL preferably includes enough steps for providing a maximum time delay which is equal to or slightly greater than a time delay of a step of the CDL. Once the DLL has stabilized to the lock point, the adjustable delay line will automatically compensate for variations in delay caused by changing temperature and voltage conditions, by varying the FDL.

In case of major drift, adjustments in the FDL will underflow/overflow its minimum/maximum delay. In that case, another CDE is switched out/in series, and at the same time the FDL is adjusted to compensate for the CDL decrease/increase to provide the same total delay as before. However, now the FDL can be used again to compensate changes without immediate danger of underflow/overflow.

It is assumed in the prior art that exchanging (or switching) a predetermined number FDL steps for a CDL step provides an equivalent delay. However, any differences between the two appear as switching jitter on the DLL output.

DLL jitter includes factors such as inherent tracking jitter, power supply noise, and substrate noise induced jitter. The inherent tracking jitter is caused by the up and down adjustments to the fine delay while the DLL is in the locked condition, and as described above, is a variation equivalent to the delay achieved through a single step in the FDL. The jitter caused by switching between the CDL and FDL elements caused by the mismatch between the elements is referred to as switching jitter. This mismatch is highly dependent on the manufacturing process, and thus is hard to predict in the design stage. As operating frequencies continue to increase, the switching jitter can undesirably reduce data eye significantly. In addition, since this switching occurs only infrequently, it is inherently difficult to detect during testing and can cause apparently randomly dropped bits when the DLL is in use in the field.

Analog techniques can be used to achieve a wide range of fine resolution tracking for various applications. In particular DLLs based on phase mixers have been shown to achieve high fine resolution tracking range through quadrature mixing. However, most analog based DLL designs employ some form of charge pumps for voltage controlled delay lines and as such they suffer from a limited resolution of the delay steps since the controlling element affects an entire delay line. In addition such DLLs often require a large acquisition time due to loop bandwidths being limited to a small fraction of the clock frequency to ensure stability of the loop. This effect also causes a poor jitter performance in analog DLLs.

Furthermore, analog DLL designs are inherently more susceptible to all sources of noise as their control variables (usually voltage) are reduced to achieve finer resolutions. In particular, synchronous dynamic random access memories (SDRAM) provide a very noisy environment for analog blocks in form of supply and substrate noise, which when combined with area restrictions in SDRAMs, sometimes preventing adequate implementation of noise prevention techniques through layout, can result in unreliable DLLs in noisy field environments.

Clearly, there is a need for an improved DLL having reduced switching jitter compared to conventional DLLs.

SUMMARY OF THE INVENTION

According to one aspect of the present invention there is provided a method for determining a number of steps of a fine delay line (FDL) which are substantially equivalent to a step of a coarse delay line (CDL), the method including steps of: providing a clock signal; delaying the clock signal by a first delay substantially equivalent to a predetermined delay plus an adjustable number of steps of the FDL to provide a first delayed clock signal; delaying the clock signal by a second delay substantially equivalent to the predetermined delay plus a step of the CDL to provide a second delayed clock signal; and adjusting the number of adjustable steps of the FDL so that the first delay is substantially equal to the second delay to provide the number of steps of the FDL that are substantially equivalent to the step of the CDL.

According to another aspect of the present invention there is provided a method for determining a number of steps of a fine delay line (FDL) that are substantially equivalent to a step of a coarse delay line (CDL), the method including steps of: providing a clock signal; delaying the clock signal by a first delay substantially equivalent to a first predetermined delay plus an adjustable number of steps of the FDL; delaying the clock signal by a second delay substantially equivalent to a second predetermined delay; adjusting the number of adjustable steps of the FDL so that the first delay is substantially equal to the second delay and providing a first number of adjustable steps of the FDL; delaying the clock signal by a third delay substantially equal to the second predetermined delay plus a step of the CDL; adjusting the number of adjustable steps of the FDL so that the first delay is substantially equal to the third delay and providing a second number of adjustable steps of the FDL; subtracting the first number from the second number of adjustable steps of the FDL to provide the number of steps of the FDL that are substantially equivalent to a step of a CDL.

According to still another aspect of the present invention there is provided a reference circuit for determining a number of steps of a fine delay line (FDL) that are substantially equivalent to a step of a coarse delay line (CDL), the reference circuit including: a first path for receiving a clock signal including: a first CDL for providing a first predetermined delay; and a first FDL for providing an adjustable number of delay steps plus a second predetermined delay, a second path for receiving the clock signal including: a second CDL for providing a third predetermined delay substantially equal to the first predetermined delay plus a step of the CDL; and a second FDL for providing a fourth predetermined delay that is substantially equal to the second predetermined delay, a phase detector for receiving outputs from the first and second paths and providing a phase difference of the outputs from the first and second paths, and a controller for: receiving the phase difference from the phase detector; providing a plurality of control signals for adjusting the number of steps of the first FDL so that a total delay of the first path is substantially equal to a total delay of the second path; and providing the number of steps of the FDL that are substantially equivalent a step of the CDL.

According to still another aspect of the present invention there is provided a delay-locked loop (DLL) including: a main coarse delay line (CDL) for delaying a main clock signal by zero or more steps of the main CDL; a main fine delay line (FDL) for further delaying the main clock signal by zero or more steps of the main FDL; and a reference circuit for determining a number of steps of the main FDL that are substantially equivalent to one step of the CDL, the reference circuit including: a first path for receiving a divided clock signal including: a first CDL for providing a first predetermined delay; and a first FDL for providing an adjustable number of delay steps plus a second predetermined delay, wherein one step of the first FDL is substantially equivalent one step of the main FDL, a second path for receiving the divided clock signal including: a second CDL for providing a third predetermined delay that is substantially equal to the first predetermined delay plus a step of the main CDL greater the first predetermined delay; and a second FDL for providing a fourth predetermined delay that is substantially equal to the second predetermined delay, a phase detector for receiving outputs from the first and second paths and providing a phase difference of the outputs from the first and second paths, and a controller for: receiving the phase difference from the phase detector; providing a plurality of control signals for adjusting the number of steps of the first FDL so that a total delay of the first path is substantially equal to a total delay of the second path; and providing the number of steps of the FDL that are substantially equivalent a step of the CDL.

A reference circuit for determining a number of steps of a fine delay line (FDL) that are substantially equivalent to a step of a coarse delay line (CDL), the reference circuit including: a FDL for receiving a clock signal, and for providing a first predetermined delay plus an adjustable number of delay steps; a CDL for receiving the clock signal, and for providing a second predetermined delay plus an adjustable number of delay steps; a phase detector for receiving outputs from the first and second paths and providing a phase difference of the outputs from the first and second paths; a controller for: receiving the phase difference from the phase detector, providing a control signal to the CDL for setting a first number of steps of the CDL, providing a plurality of control signals for adjusting a first number of steps of the FDL so that a total delay of FDL is substantially equal to a total delay of the CDL, providing the control signal to the CDL for setting a second number of steps of the CDL wherein the second number of delay steps is equal to the first number of delay steps plus one, providing the plurality of control signals for adjusting a second number of steps of the FDL so that the total delay of FDL is substantially equal to the total delay of the CDL, and subtracting the first number of steps of the FDL from the second number of steps of the FDL, and providing the number of steps of the FDL that are substantially equivalent a step of the CDL.

According to another aspect of the invention there is provided a delay-locked loop (DLL) including: a main coarse delay line (CDL) for delaying a main clock signal by zero or more steps of the coarse delay line; a main fine delay line (FDL) for further delaying the main clock signal by zero or more steps of the FDL; and a reference circuit for determining a number of steps of a fine delay line (FDL) that are substantially equivalent to a step of a coarse delay line (CDL), the reference circuit including: a FDL for receiving a clock signal, and for providing a first predetermined delay plus an adjustable number of delay steps; a CDL for receiving the clock signal, and for providing a second predetermined delay plus an adjustable number of delay steps; a phase detector for receiving outputs from the first and second paths and providing a phase difference of the outputs from the first and second paths; a controller for: receiving the phase difference from the phase detector, providing a control signal to the CDL for setting a first number of steps of the CDL, providing a plurality of control signals for adjusting a first number of steps of the FDL so that a total delay of FDL is substantially equal to a total delay of the CDL, providing the control signal to the CDL for setting a second number of steps of the CDL wherein the second number of delay steps is equal to the first number of delay steps plus one, providing the plurality of control signals for adjusting a second number of steps of the FDL so that the total delay of FDL is substantially equal to the total delay of the CDL, and subtracting the first number of steps of the FDL from the second number of steps of the FDL, and providing the number of steps of the FDL that are substantially equivalent a step of the CDL.

Advantageously, the present invention therefore provides a reference circuit and method for mitigating switching jitter and a DLL having reduced switching jitter compared to conventional DLLs.

BRIEF DESCRIPTION OF THE DRAWINGS

Further features and advantages of the present invention will become apparent from the following detailed description, taken in combination with the appended drawings, in which.

DESCRIPTION OF EMBODIMENTS

Figure 1:
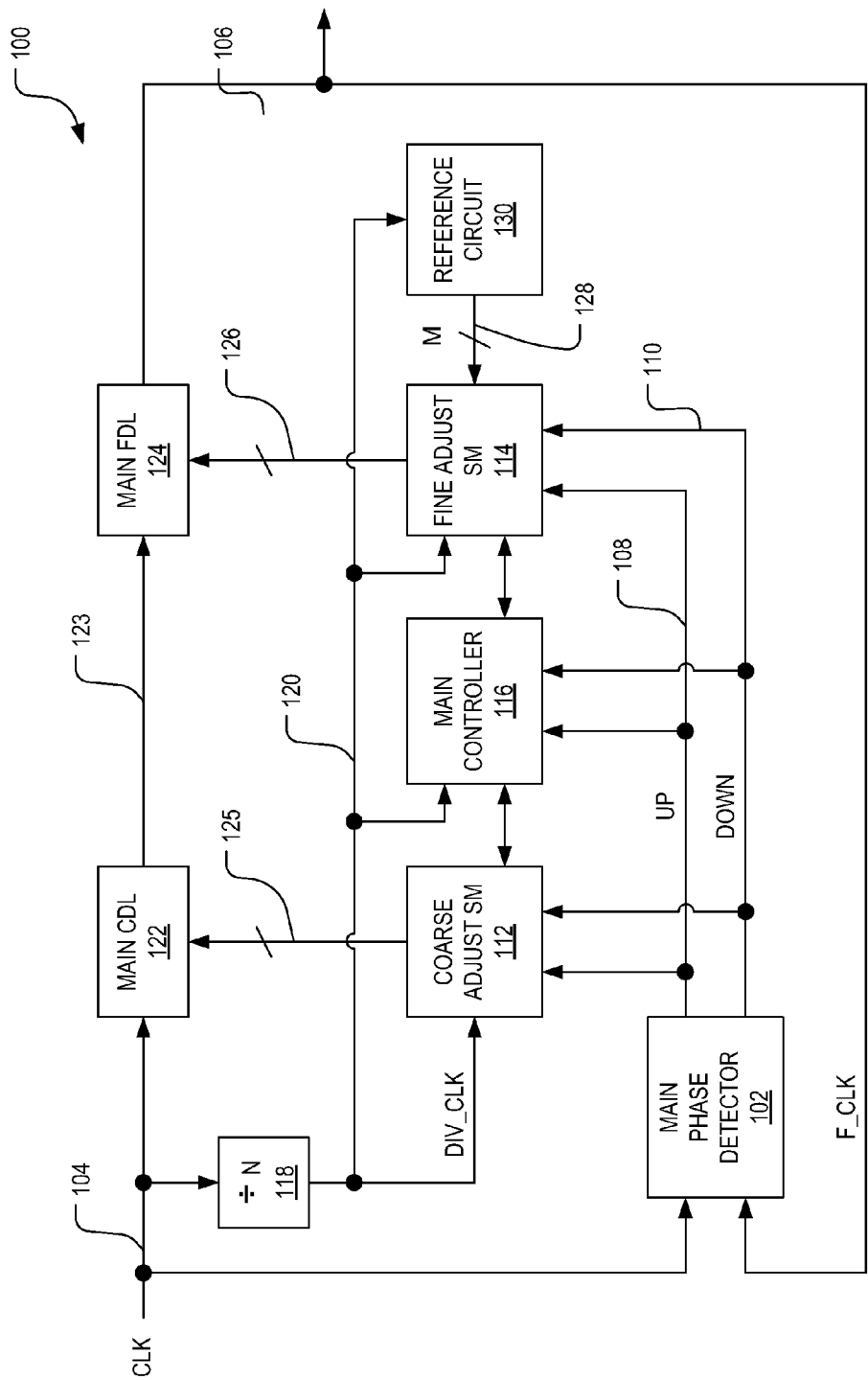
FIG. 1 is a block diagram an embodiment of a delay-locked loop (DLL) in accordance with the present invention.

FIG. 1 illustrates a delay-locked loop (DLL) 100 in accordance with an embodiment of the present invention. A main phase detector 102 receives a main clock (CLK) signal 104 and a feedback clock (F_CLK) signal 106, compares a phase of the F_CLK signal 106 with a phase of the CLK signal 104, and issues up 108 and down 110 count control signals to a coarse adjust state machine 112, and fine adjust state machine 114. The up and down signals 108,110 are also monitored by a main controller 116, which controls the state machines 112,114.

The main coarse adjust state machine 112 preferably includes a one state per flip-flop type state machine for providing a fully decoded output 125 to a main coarse delay line (CDL) 122. Alternatively, the main coarse adjust state machine 112 may include an up/down counter and thermometer decoder for providing a fully decoded output 125 to the main CDL 122.

The main fine adjust state machine 114 also preferably includes a one state per flip-flop type state machine for providing a fully decoded output to a main fine delay line (FDL) 124. Alternatively, the main fine adjust state machine 114 may include an up/down counter and thermometer decoder for providing a fully decoded output 126 to the main FDL 124.

The outputs 125,126 of the main coarse adjust state machine 112 and fine adjust state machine 114 are preferably tri-state logic signals. A low impedance output enables a respective coarse delay element (CDE) or fine delay element (FDE) (described herein below). A high impedance output disables a respective CDE 206 or FDE 306 thereby reducing a number of steps of the CDL 122 or FDL 124.

The CLK signal 104 is provided to an input of the main CDL 122, and an output 123 of the main CDL 122 is provided to the input of the main FDL 124. The main FDL 124 provides the F_CLK signal 106 to the main phase detector 102. The F_CLK signal 106 is also provided as an output of the DLL 100 having substantially zero delay from the CLK signal 104.

Figure 2:
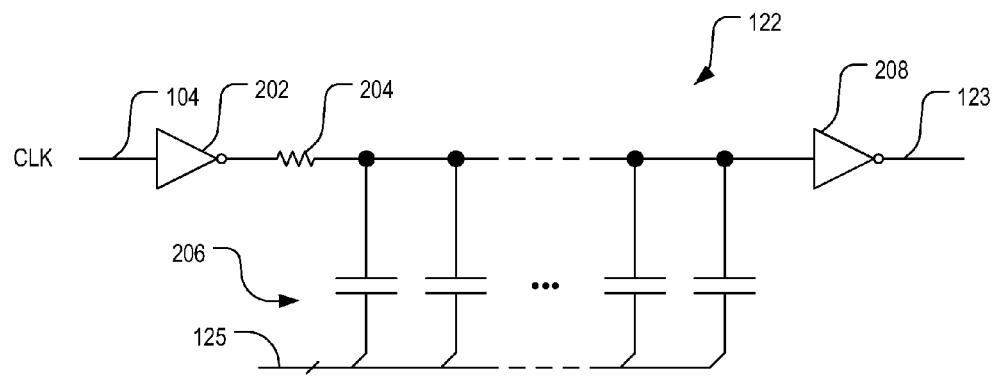
FIG. 2 is a schematic diagram of an embodiment of a main coarse delay line (CDL) shown in FIG. 1.

Referring to FIG. 2, the main CDL 122 includes a plurality of CDEs 206, each CDE is preferably a substantially equal valued capacitor based RC delay element. A buffer driver 202 receives the CLK signal 104 and drives a series resistor 204 followed by a plurality of substantially equal valued capacitors 206 which are selectable by tri-state logic signals 125 output from the coarse adjust state machine 112. A step of the CDL 122 is defined as a incremental delay provided by enabling a CDE 206.

Figure 3:
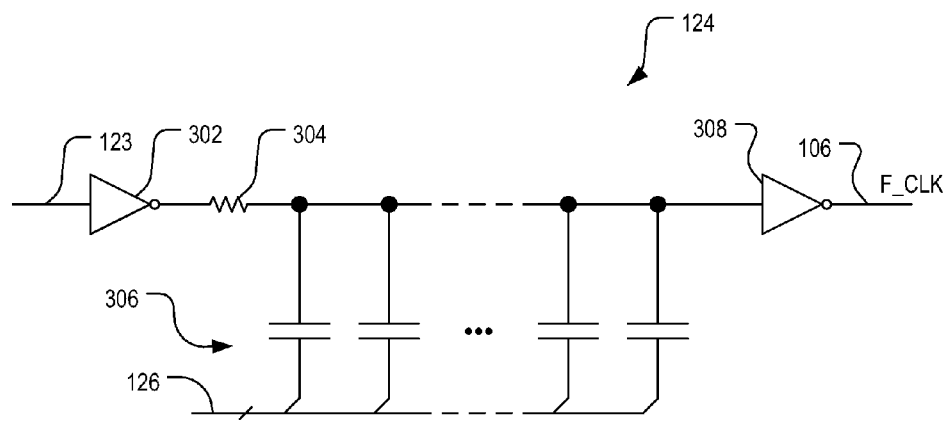
FIG. 3 is a schematic diagram of an embodiment a main fine delay line (FDL) shown in FIG. 1.

Referring to FIG. 3, the main FDL 124 includes a plurality of FDEs 306, each FDE is preferably a substantially equal valued capacitor based RC delay element. A buffer driver 302 receives an output 123 from the main CDL 122 and drives a series resistor 304 followed by a plurality of substantially equal valued capacitors 306 which are selectable by tri-state logic signals 126 output from the fine adjust state machine 114. A step of the FDL 124 is defined as a incremental delay provided by enabling a FDE 306.

The embodiments of the CDL 122 and FDL 124 shown in FIGS. 2 and 3 are simplified for clarity. Those skilled in the art will appreciate that the CDL 122 and FDL 124 may include more buffers, resistors, and transistors than those shown in order to provide specified maximum delays of the CDL 122 and FDL 124. For example, U.S. Pat. No. 7,190,202, "TRIM UNIT HAVING LESS JITTER", to OH, issued Mar. 13, 2007, which is hereby incorporated by reference, provides a delay line wherein each delay element includes a select transistor and a load capacitor coupled in series between the delay line and ground potential, and includes a filter circuit having an input to receive an enable signal and having an output coupled to a gate of the select transistor.

Referring again to FIG. 1, the main controller 116 controls the coarse adjust state machine 112 and fine adjust state machine 114 to adjust a number of steps of the main CDL 122 and main FDL 124 in order to lock the phases the CLK 104 and F_CLK 106 signals together as closely as possible.

The main controller 116 senses overflow of the main fine adjust state machine 114. Overflow is defined as a number of the signals 126 to the main FDL 124 in the low impedance state being greater than a predefined upper limit. Thereupon the main controller 116 controls the coarse adjust state machine 112 to increase the number of coarse delay elements enabled by one by increasing the number of the signals 125 to the main coarse adjust line 122 in low impedance state by one, and controls the fine adjust state machine 114 to lower the number of fine delay elements enabled by M 128 by reducing the number of signals 126 to the main fine adjust delay line 124 in the low impedance state by M 128, where M 128 is substantially equal to a number of steps of the main FDL 124 needed to provide a delay substantially equal to one step of the main CDL 122. A value of M 128 is provided by a reference circuit 130 (described herein below).

The main controller 116 also senses underflow of the main fine adjust state machine 114. Underflow is defined as a number of the signals 126 to the main fine adjust line 120 in the low impedance state being less than a predefined lower limit. Thereupon the main controller 116 controls the coarse adjust state machine 112 to decrease the number of coarse delay elements 206 enabled by one by decreasing the number of the signals 125 to the main CDL 122 in low impedance state by one, and controls the fine adjust state machine 114 to increase the number of fine delay elements enabled by M 128 by increasing the number of signals 126 to the main FDL 124 in the low impedance state by M 128.

A range of the main FDL 124, defined as a difference between the predefined upper limit and the predefined lower limit, preferably chosen to be greater than or equal to a step of the main CDL 122 over all specified operating conditions.

A DIV_CLK signal 120 is provided to the coarse adjust state machine 112, main controller 116, fine adjust state machine 114, and reference circuit 130. A frequency the DIV_CLK signal 120 is preferably a submultiple (that is, divided by N) of a frequency of the main clock 104 for reducing power requirements.

Figure 4:
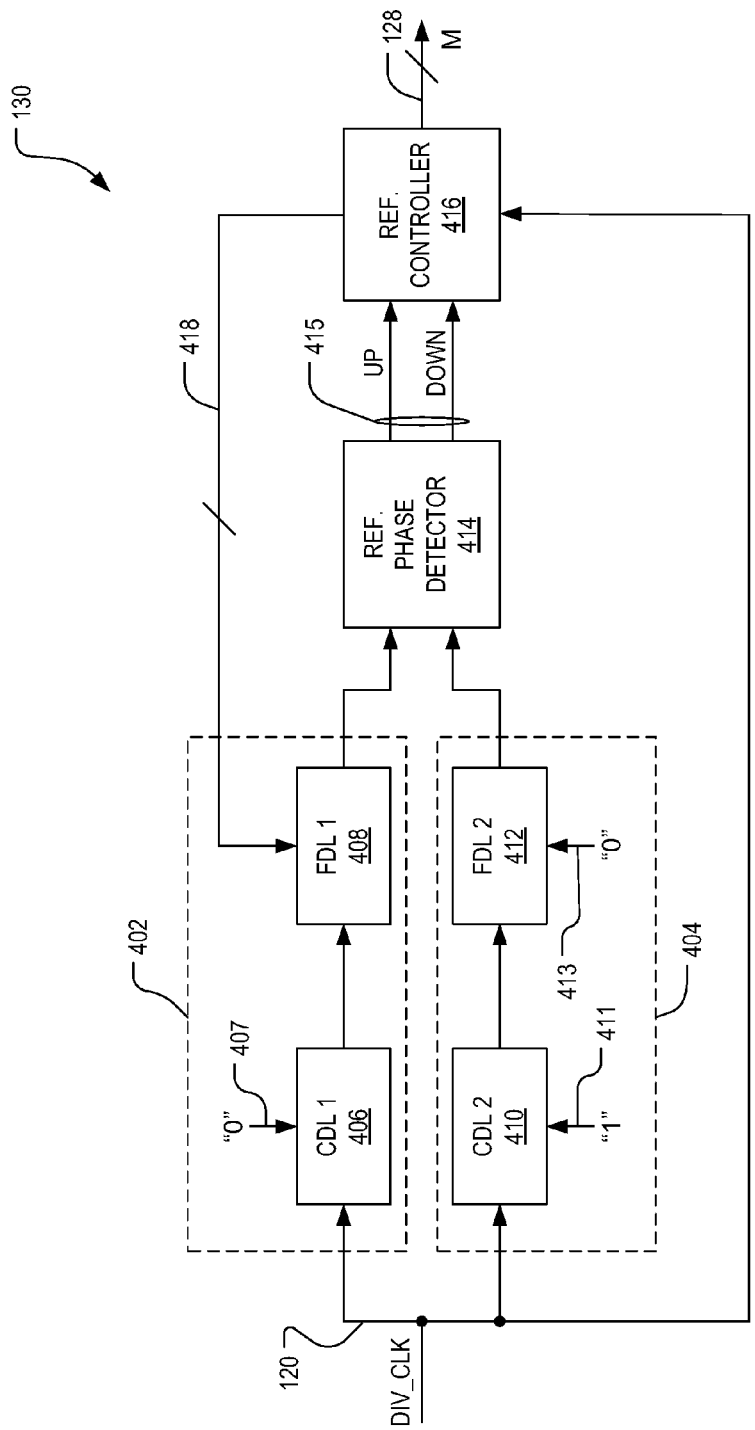
FIG. 4 is a block diagram of a first embodiment of a reference circuit shown in FIG. 1.

Referring to FIG. 4, a block diagram of a first embodiment of the reference circuit 130 is shown. A first delay path 402 receives the DIV_CLK signal 120. A first CDL 406 provides a first predetermined delay. The first CDL 406 is similar (that is, having substantially equal delay steps but preferably having a fewer number of CDEs than the main CDL 406 for reducing circuit area requirements) to the main CDL 122 but having its inputs 407 preferably set to "0" (that is, all inputs are hardwired a high impedance state). Alternatively, a small number (X) compared to a total number of CDEs of the main CDL 122, of the inputs 407 of the first CDL 406 may be set to a low impedance state.

The first delay path 402 also includes a first FDL 408 that is similar (that is, having substantially equal delay steps and preferably a substantially equal number of FDEs) to the main FDL 124. The first FDL 408 receives a plurality of signals 418 from a reference circuit controller 416 for adjusting a number of steps of the first FDL 408.

A total delay of the first path 402 is substantially equal to a delay of the first CDL 406 plus a delay of the first FDL 408. An output of the first path 402 is provided to a reference circuit phase detector 414. It should be noted that the order of the first CDL 406 and the first FDL 408 may be reversed from that shown in FIG. 4 and still be within the present invention.

A second delay path 404 also receives the DIV_CLK signal 120. A second CDL 410 provides a second predetermined delay. The second CDL 410 is similar (that is, having a substantially equal intrinsic delay and having substantially equal delay steps) to the first CDL 406 but having its inputs 411 preferably set to "1" (meaning that all but one inputs are set to a high impedance state, the other set to a low impedance state). Generally, a number of steps of the second CDL 410 is chosen to be one greater (X+1) than the first CDL 406.

The second delay path 404 also includes a second fine delay line 412 that is substantially similar (that is, having a substantially equal intrinsic delay and having substantially equal delay steps) to the first FDL 408 but having all of its inputs 413 set to "0" (that is, all inputs 413 are set to a high impedance state).

A total delay of the second delay path 404 is substantially equal to a delay of the second CDL 410 plus a delay of the second FDL 412. An output of the second path 408 is provided to the reference circuit phase detector 414. It should be noted that the order of the second CDL 410 and the second FDL 412 may be reversed from that shown in FIG. 4 and still be within the present invention.

Since the delay lines 406,408,410,412 in the reference circuit 130 are preferably manufactured simultaneously with the main CDL 122 and main FDL 124, and are preferably located on the same integrated circuit in close proximity and same orientation, they will exhibit substantially the same characteristics over time, temperature, and process variation.

Outputs of the first delay path 402 and the second delay path 404 are connected to inputs of a phase detector 414 that is preferably substantially identical to the main phase detector 102. The phase detector 414 provides a phase difference 415 preferably as up count and down count signals to the reference circuit controller 416.

The reference circuit controller 416 provides a fully decoded set of control signals 418 to the first FDL 408. The reference circuit controller 416 may include a one-state per flip-flop type state machine wherein outputs of the flip-flops directly provide the control signals to the first FDL 408. Alternatively, the reference circuit controller 416 may include an up/down counter and a thermometer decoder for providing the control signals 418 to the first FDL 408.

The reference circuit controller 416 adjusts the control signals 418 provided to the first FDL 408 so that the phase difference 415 is substantially zero and therefore the total delay of the first delay path 402 is substantially equal to the total delay of the second delay path 404. M 128 is continually updated as the temperature and voltage conditions change, thereby providing an accurate count of the FDEs that ensures a minimum mismatch between the steps of the main CDL 122 and the steps of the main FDL 124 across process parameters and temperature and voltage drifts.

Figure 5:
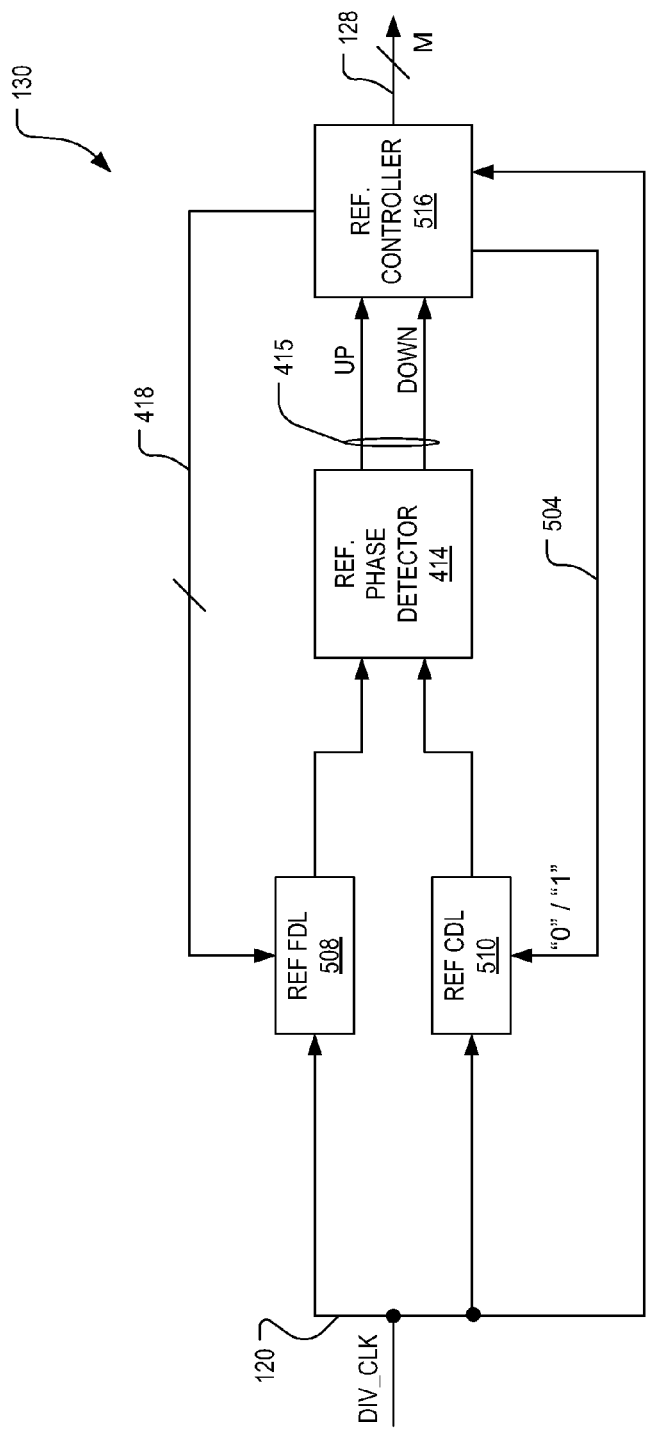
FIG. 5 is a block diagram of a second embodiment of the reference circuit shown in FIG. 1.

Referring to FIG. 5, a block diagram of a second embodiment of the reference circuit 130 is shown. The reference circuit 130 includes a reference FDL 508 that is similar (that is, having substantially equal delay steps and preferably a substantially equal number of delay steps) to the main FDL 124 and first FDL 408. The reference FDL 508 receives a plurality of signals 418 from a reference circuit controller 516 for adjusting a number of steps of the reference FDL 508.

A reference CDL 510 also receives the DIV_CLK signal 120. The reference CDL 510 is similar (that is, having a substantially equal intrinsic delay and having substantially equal delay steps) to the main CDL 122. The second CDL 510 also receives a signal 504 from the reference circuit controller 516 for adjusting a number of steps of the reference circuit CDL 510.

Outputs of the reference circuit FDL 508 and the reference circuit CDL 510 are connected to inputs of a phase detector 414 that is preferably substantially identical to the main phase detector 102. The phase detector 414 provides a phase difference 415 preferably as up count and down count signals to the reference circuit controller 516.

The reference circuit controller 516 provides a fully decoded set of control signals 418 to the reference circuit FDL 508. The reference circuit controller 516 may include a one-state per flip-flop type state machine wherein outputs of the flip-flops directly provide the control signals to the first FDL 508. Alternatively, the reference circuit controller 516 may include an up/down counter and a thermometer decoder for providing the control signals 418 to the reference circuit FDL 508.

Firstly, a number of steps of the reference circuit CDL 510 is set to "0" (that is, the input 504 is set to a high impedance state). A reference circuit controller 516 adjusts the control signals 418 provided to the reference circuit FDL 508 so that a delay of the reference circuit FDL 508 is substantially equal to a delay of the reference circuit CDL 510 by setting a first number of control lines 418 to a low impedance state and the rest to the high impedance state.

Secondly, a number of steps of the reference circuit CDL 510 is set to "1" (that is, the input 504 is set to a low impedance state). The reference circuit controller 516 adjusts the control signals 418 provided to the reference circuit FDL 508 so that a delay of the reference circuit FDL 508 is substantially equal to a delay of the reference circuit CDL 510 by setting a second number of control lines 418 to a low impedance state and the rest to the high impedance state.

Thirdly, the reference circuit controller 516 subtracts the first number from the second number thereby providing a third number M 128 which is substantially equal the number of steps of the main FDL 124 that are equivalent to a steps of the main CDL 122. It should be noted that the first and second number can be determined in any order and still be within the present invention.

M 128 is continually updated as the temperature and voltage conditions change, thereby providing an accurate number of the FDEs that ensures a minimum mismatch between the CDL 122 and the FDL 124 across process parameters and temperature and voltage drifts.

Figure 6:
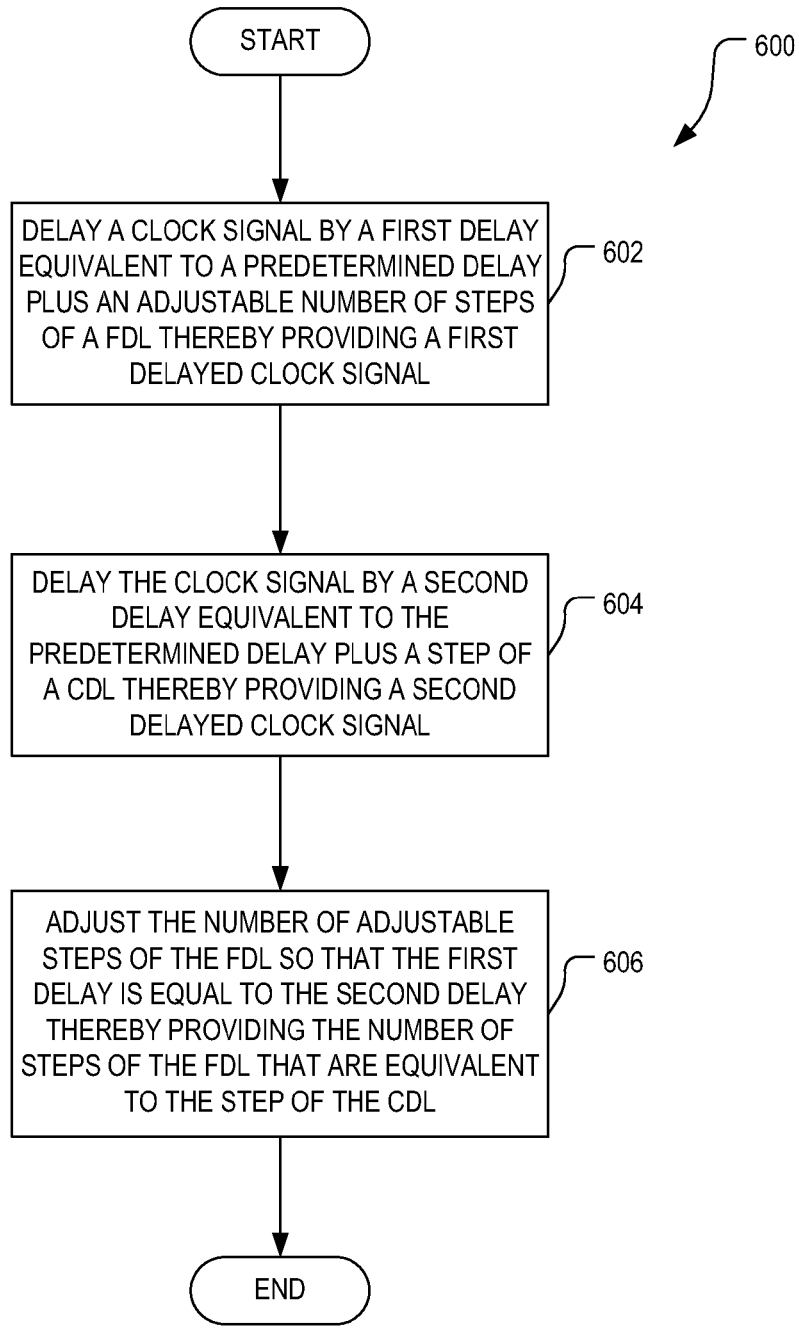
FIGS. 6 to 9 are flowcharts of a first method of determining a number of steps of a FDL that are equivalent to a step of a CDL.

Referring to FIG. 6, a method 600 for determining a number of steps of a FDL that are substantially equivalent to a step of a CDL according to the present invention is provided.

The method 600 includes steps of i) 602 delaying a clock signal 120 by a first delay 402 substantially equivalent to a predetermined delay plus an adjustable number of steps of the FDL thereby providing a first delayed clock signal, ii) 604 delaying the clock signal by a second delay 404 substantially equivalent to the predetermined delay plus a step of the CDL thereby providing a second delayed clock signal, and iii) 606 adjusting the number of adjustable steps of the FDL so that the first delay is substantially equal to the second delay thereby providing the number of steps 128 of the FDL that are substantially equivalent to the step of the CDL.

Figure 7:
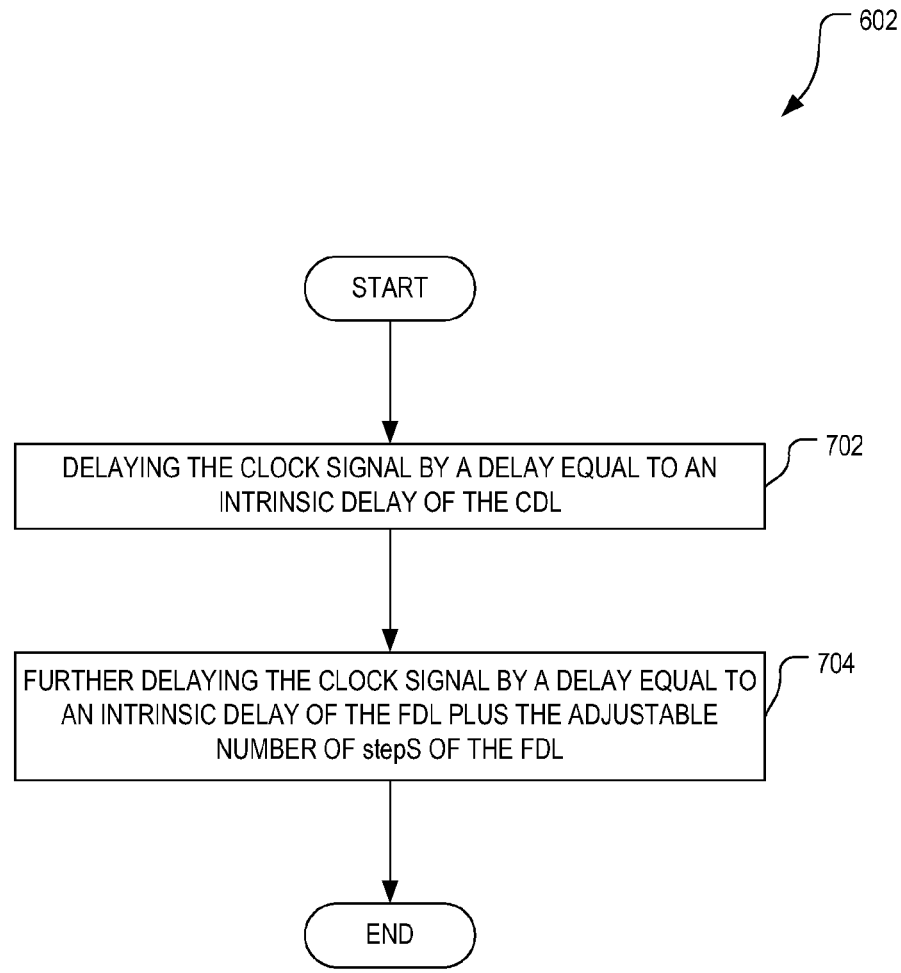

In step i) 602 (FIG. 7), the clock signal 120 is preferably delayed by a delay substantially equal to an intrinsic delay of the CDL 702, plus a delay substantially equal to an intrinsic delay of the FDL, plus the adjustable number of steps of the FDL 704.

Figure 8:
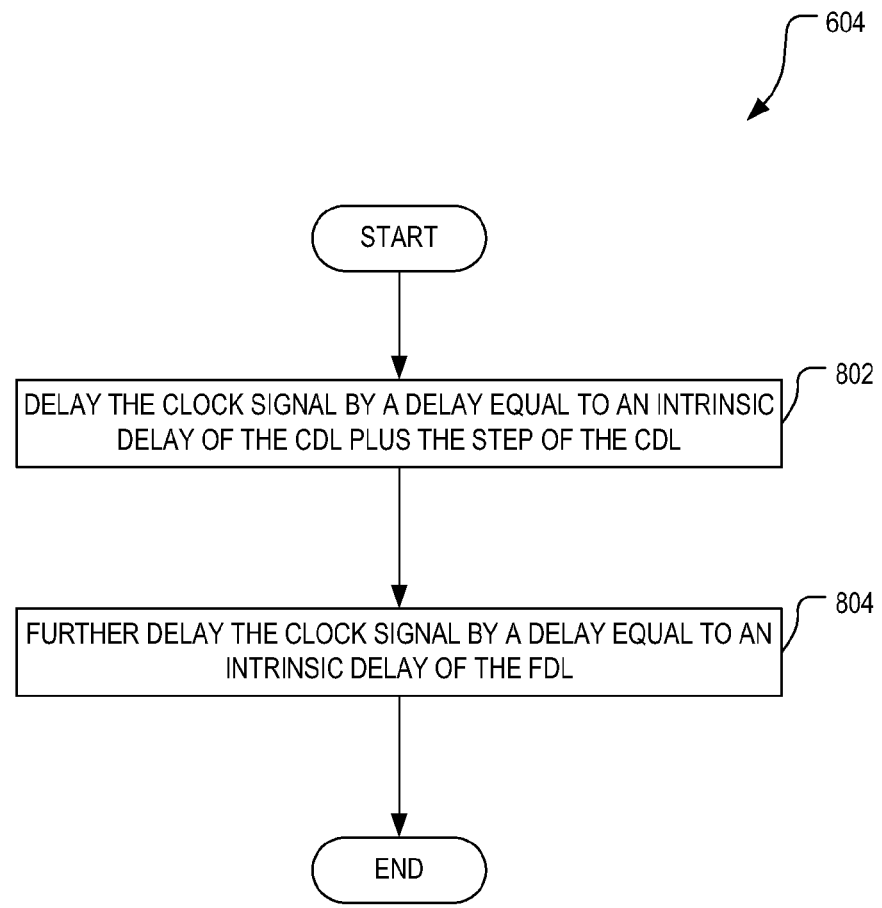

In step ii) 604 (FIG. 8), the clock signal 120 is preferably delayed by delay substantially equal to an intrinsic delay of the CDL plus the step of the CDL 802, plus a delay substantially equal to an intrinsic delay of the FDL 804.

Figure 9:
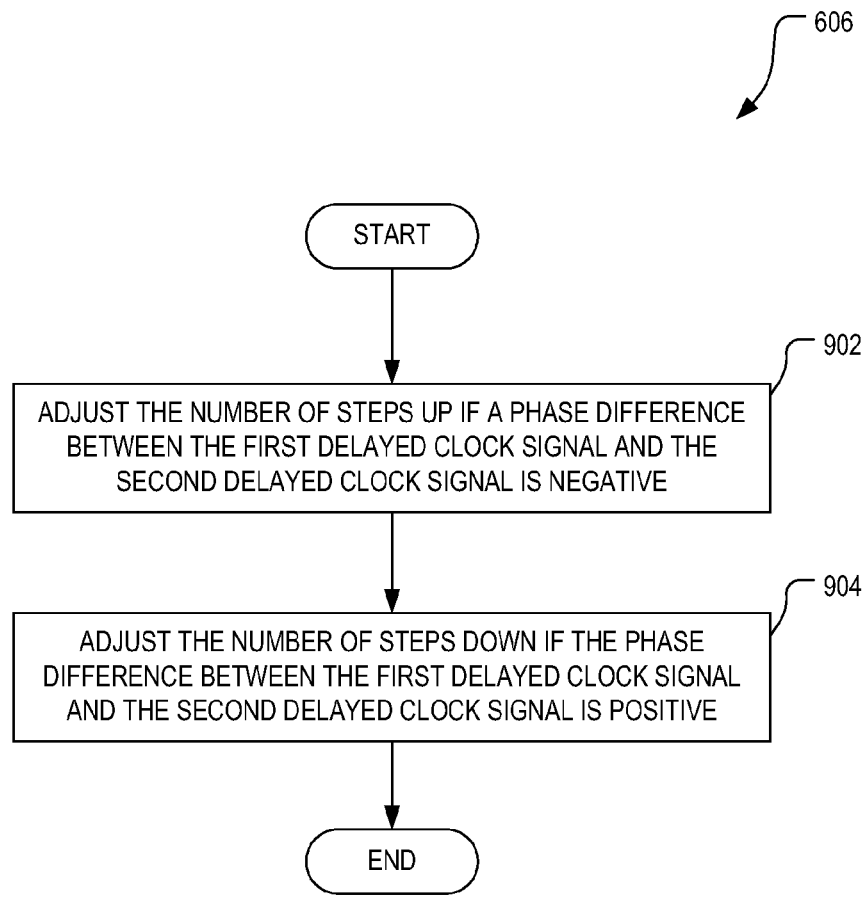

In step iii) 606 (FIG. 9), if the first delay is less than the second delay then the number of adjustable steps of the FDL is preferably adjusted up 902 and if the first delay is greater than the second delay the number of adjustable steps of the FDL is preferably adjusted down 904.

Figure 10:
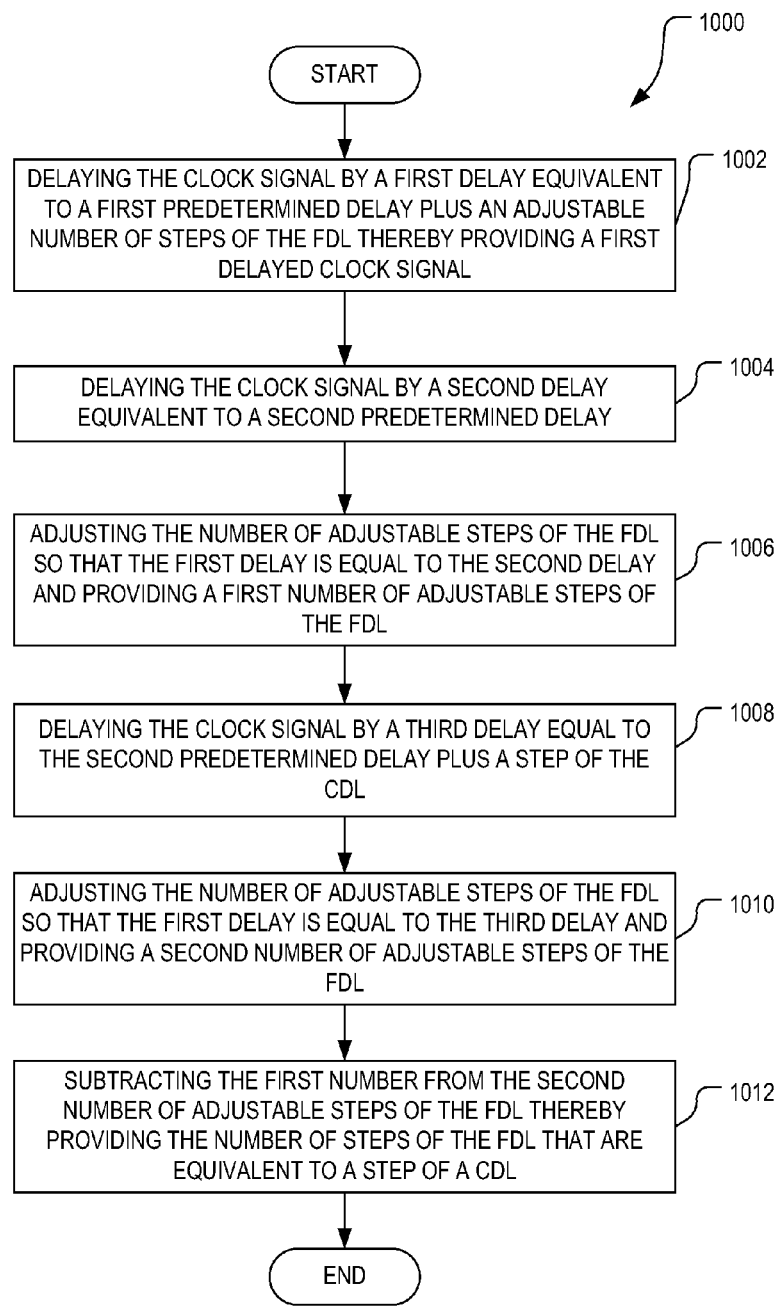
FIGS. 10 to 15 are flowcharts of a second method of determining a number of steps of the FDL that are equivalent to a step of the CDL.

Referring to FIG. 10, another method 1000 for determining a number of steps of a FDL that are substantially equivalent to a step of a CDL according to the present invention is provided.

The method 1000 includes steps of i) 1002 delaying the clock signal 120 by a first delay substantially equivalent to a first predetermined delay plus an adjustable number of steps of the FDL, ii) 1004 delaying the clock signal by a second delay substantially equivalent to a second predetermined delay, iii) 1006 adjusting the number of adjustable steps of the FDL so that the first delay is substantially equal to the second delay and providing a first number of adjustable steps of the FDL, iv) 1008 delaying the clock signal by a third delay substantially equal to the second predetermined delay plus a step of the CDL, v) 1010 adjusting the number of adjustable steps of the FDL so that the first delay is substantially equal to the third delay and providing a second number of adjustable steps of the FDL, and vi) 1012 subtracting the first number from the second number of adjustable steps of the FDL thereby providing the number of steps of the FDL that are substantially equivalent to a step of a CDL.

Figure 11:
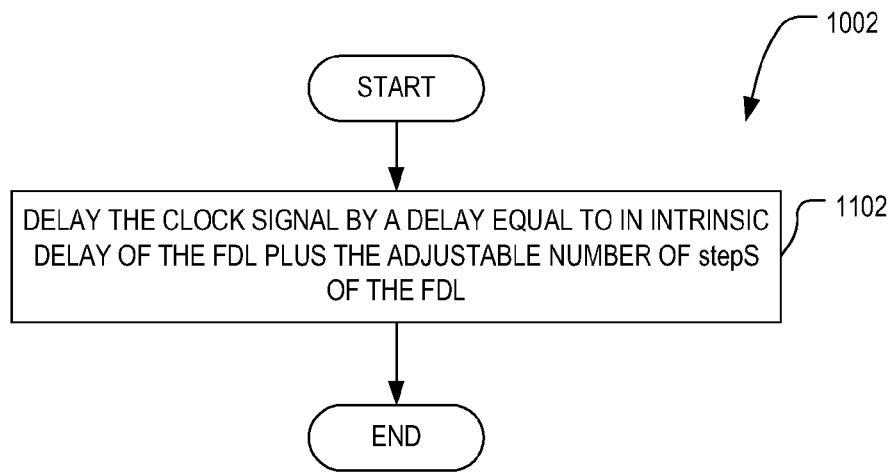

In step i) 1002 (FIG. 11) the clock signal is preferably delayed by a delay substantially equal to in intrinsic delay of the FDL plus the adjustable number of steps of the FDL.

Figure 12:
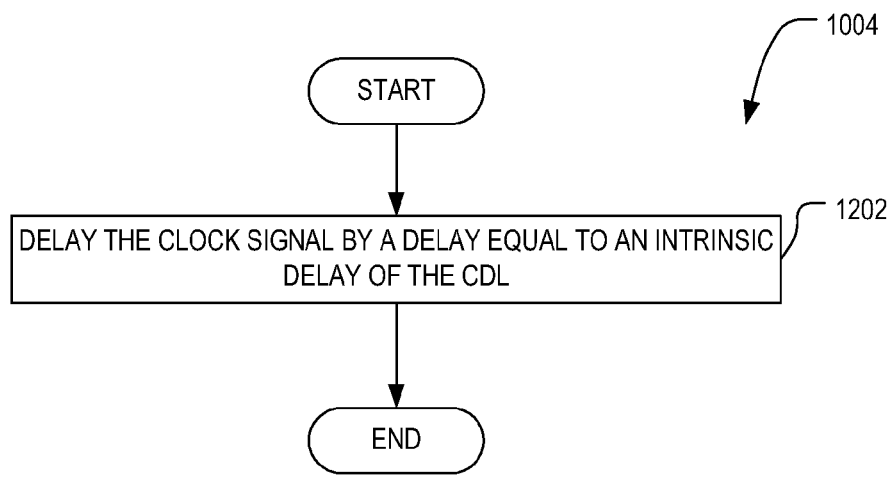

In step ii) 1004 (FIG. 12) the clock signal is preferably delayed by a delay substantially equal to an intrinsic delay of the CDL.

Figure 13:
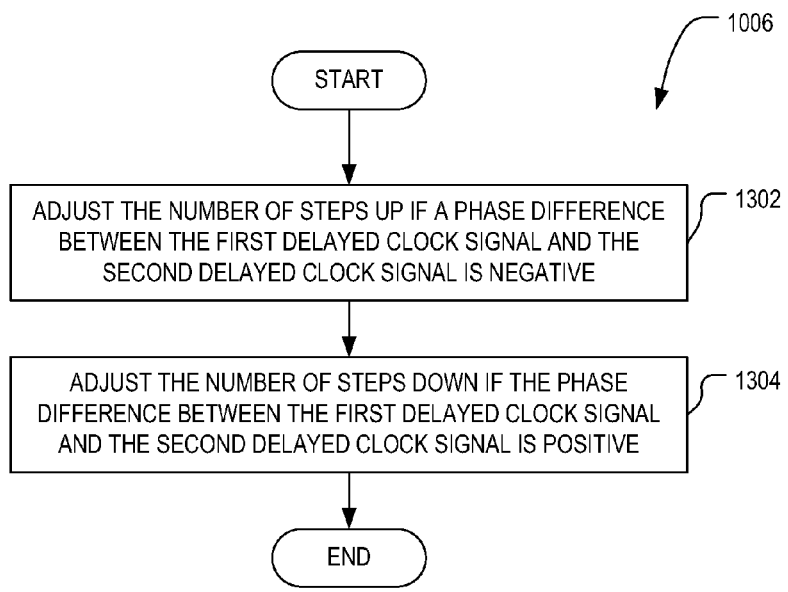

In step iii) 1006 (FIG. 13) if the first delay is less than the second delay the number of steps is preferably adjusted up, and if the first delay is greater than the second delay the number of steps is preferably adjusted down.

Figure 14:
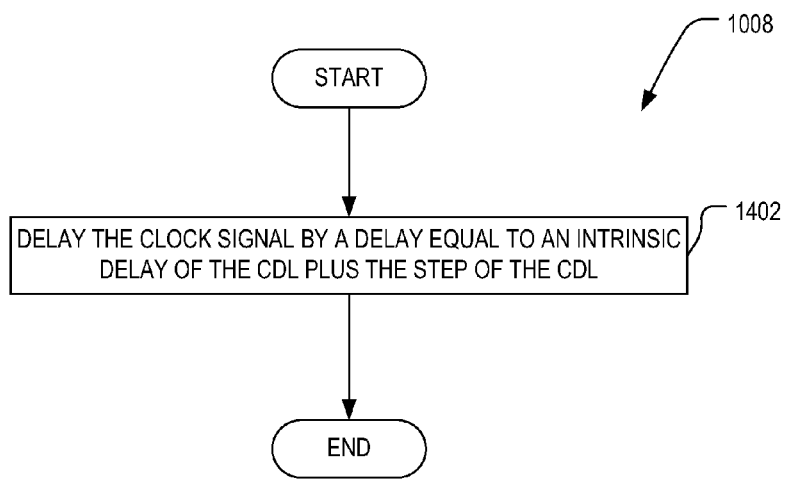

In step iv) 1008 (FIG. 14) the clock signal is preferably delayed by a delay substantially equal to an intrinsic delay of the CDL plus the step of the CDL.

Figure 15:
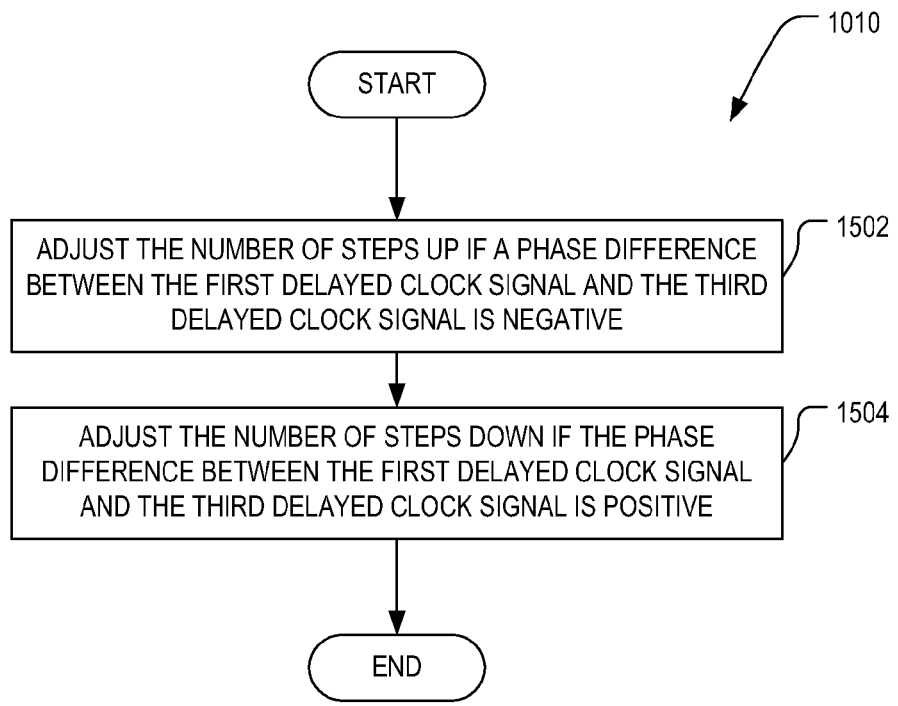

In step v) 1010 (FIG. 15) if the first delay is less than the third delay the number of steps is preferably adjusted up, and if the first delay is greater than the third delay the number of steps is preferably adjusted down.

While the above embodiments have been described using the DLL as the circuit to which they are applied in order to reduce switching jitter, the concepts can be used in other applications that involve tracking delays with respect to any reference delay path. For example, the invention can be used in clock recovery circuits, pin timing tuners used in integrated circuit testers, etc.

The DLL 100 provided is especially useful for clock tree management in field programmable gate arrays (FPGAs) and application specific integrated circuits (ASICs). Also, synchronous integrated circuits such as synchronous dynamic random access memories (SDRAMs), synchronous static random access memories (SSRAMs), serially connected memories such as FLASH may benefit using the DLL 100 for synchronizing an external clock signal to internal operations.

The embodiments of the invention described above are intended to be exemplary only. The scope of the invention is therefore intended to be limited solely by the scope of the appended claims.

Table of Elements

| Element Name | Reference Number |
|---|---|
| delay-locked loop (DLL) | 100 |
| main phase detector | 102 |
| main clock (CLK) | 104 |
| feedback clock (F_CLK) | 106 |
| up count control line | 108 |
| down count control line | 110 |
| coarse adjust state machine | 112 |
| fine adjust state machine | 114 |
| main controller | 116 |
| divided clock (DIV_CLK) | 120 |
| main coarse delay line (CDL) | 122 |
| main CDL output/main FDL input | 123 |
| main fine delay line (FDL) | 124 |
| coarse adjust state machine outputs/main CDL inputs | 125 |
| fine adjust state machine outputs/main FDL inputs | 126 |
| reference circuit output (M) | 128 |
| reference circuit | 130 |
| main CDL input buffer | 202 |
| main CDL resistor | 204 |
| main CDL delay elements (CDE) | 206 |
| main CDL output buffer | 208 |
| main FDL input buffer | 302 |
| main FDL resistor | 304 |
| main FDL delay elements (FDE) | 306 |
| main FDL output buffer | 308 |
| first delay path | 402 |
| second delay path | 404 |
| first CDL | 406 |
| first CDL input | 407 |
| first FDL | 408 |
| second CDL | 410 |
| second CDL input | 411 |
| second FDL | 412 |
| second FDL input | 413 |
| reference circuit phase detector | 414 |
| reference circuit phase difference | 415 |
| reference circuit controller | 416 |
| reference circuit controller output/first FDL input | 418 |
| reference circuit CDL control signal | 504 |
| reference circuit FDL | 508 |
| reference circuit CDL | 510 |
| reference circuit FDL control signal | 518 |
| first method for determining number of steps | 600-904 |
| second method for determining number of steps | 1000-1504 |

I claim:

1. A method for determining a number of steps of a fine delay line (FDL) that are substantially equivalent to a step of a coarse delay line (CDL), the method comprising steps of:

providing a clock signal;
delaying the clock signal by a first delay substantially equivalent to a first predetermined delay plus an adjustable number of steps of the FDL;
delaying the clock signal by a second delay substantially equivalent to a second predetermined delay;
adjusting the number of adjustable steps of the FDL so that the first delay is substantially equal to the second delay and providing a first number of adjustable steps of the FDL;
delaying the clock signal by a third delay substantially equal to the second predetermined delay plus a step of the CDL;
adjusting the number of adjustable steps of the FDL so that the first delay is substantially equal to the third delay and providing a second number of adjustable steps of the FDL; and
subtracting the first number from the second number of adjustable steps of the FDL to provide the number of steps of the FDL that are substantially equivalent to the step of the CDL.

2. A method as claimed in claim 1 wherein the step of delaying the clock signal by the first delay comprises a step of:
delaying the clock signal by a delay substantially equal to in intrinsic delay of the FDL plus the adjustable number of steps of the FDL.

3. A method as claimed in claim 1 wherein the step of delaying the clock signal by the second delay comprises a step of:
delaying the clock signal by a delay substantially equal to an intrinsic delay of the CDL.

4. A method as claimed in claim 1 wherein the step of adjusting the number of steps of the FDL so that the first delay is substantially equal to the second delay comprises steps of:
adjusting the number of steps up if the first delay is less than the second delay; and
adjusting the number of steps down if the first delay is greater than the second delay.

5. A method as claimed in claim 1 wherein the step of delaying the clock signal by the third delay comprises a step of:
delaying the clock signal by a delay substantially equal to an intrinsic delay of the CDL plus the step of the CDL.

6. A method as claimed in claim 1 wherein the step of adjusting the number of steps of the FDL so that the first delay is substantially equal to the third delay comprises steps of:
adjusting the number of steps up if the first delay is less than the third delay; and
adjusting the number of steps down if the first delay is greater than the third delay.

7. A reference circuit for determining a number of steps of a fine delay line (FDL) that are substantially equivalent to a step of a coarse delay line (CDL), the reference circuit comprising:
a FDL for receiving a clock signal, and for providing a first predetermined delay plus an adjustable number of delay steps,
a CDL for receiving the clock signal, and for providing a second predetermined delay plus an adjustable number of delay steps,
a phase detector for receiving outputs from the FDL and CDL and providing a phase difference of the outputs from the FDL and CDL, and
a controller for:
receiving the phase difference from the phase detector;
providing a control signal to the CDL for setting a first number of steps of the CDL;
providing a plurality of control signals for adjusting a first number of steps of the FDL so that a total delay of FDL is substantially equal to a total delay of the CDL;
providing the control signal to the CDL for setting a second number of steps of the CDL wherein the second number of delay steps is equal to the first number of delay steps plus one;
providing the plurality of control signals for adjusting a second number of steps of the FDL so that the total delay of FDL is substantially equal to the total delay of the CDL;
subtracting the first number of steps of the FDL from the second number of steps of the FDL; and
providing the difference as the number of steps of the FDL that are substantially equivalent to the step of the CDL.

8. A reference circuit as claimed in claim 7 wherein the first predetermined delay is substantially equal to an intrinsic delay of the FDL.

9. A reference circuit as claimed in claim 7 wherein the second predetermined delay is substantially equal to an intrinsic delay of the CDL.

10. A reference circuit as claimed in claim 7 wherein the second predetermined delay is substantially greater than the first predetermined delay.

11. A delay-locked loop (DLL) comprising:
a main coarse delay line (CDL) for delaying a main clock signal by zero or more steps of the coarse delay line,
a main fine delay line (FDL) for further delaying the main clock signal by zero or more steps of the FDL, and
a reference circuit for determining a number of steps of a fine delay line (FDL) that are substantially equivalent to a step of a coarse delay line (CDL), the reference circuit including:
a FDL for receiving a clock signal, and for providing a first predetermined delay plus an adjustable number of delay steps;
a CDL for receiving the clock signal, and for providing a second predetermined delay plus an adjustable number of delay steps;
a phase detector for receiving outputs from the FDL and CDL and providing a phase difference of the outputs from the FDL and CDL; and
a controller for:
receiving the phase difference from the phase detector,
providing a control signal to the CDL for setting a first number of steps of the CDL,
providing a plurality of control signals for adjusting a first number of steps of the FDL so that a total delay of FDL is substantially equal to a total delay of the CDL,
providing the control signal to the CDL for setting a second number of steps of the CDL wherein the second number of delay steps is equal to the first number of delay steps plus one,
providing the plurality of control signals for adjusting a second number of steps of the FDL so that the total delay of FDL is substantially equal to the total delay of the CDL,
subtracting the first number of steps of the FDL from the second number of steps of the FDL, and providing the difference as the number of steps of the FDL that are substantially equivalent to the step of the CDL.

12. A DLL as claimed in claim 11 wherein the first predetermined delay is substantially equal to an intrinsic delay of the FDL.

13. A DLL as claimed in claim 11 wherein the second predetermined delay is substantially equal to an intrinsic delay of the CDL.

* * * * *